United States Patent [19]

Gokan et al.

[11] Patent Number: 4,894,624
[45] Date of Patent: Jan. 16, 1990

[54] COMBINED AMPLITUDE MODULATOR AND FREQUENCY CONVERTER

[75] Inventors: Akira Gokan, Oi; Hiroshi Wakabayashi, Hanno, both of Japan

[73] Assignee: New Japan Radio Co., Ltd., Tokyo, Japan

[21] Appl. No.: 140,505

[22] Filed: Jan. 4, 1988

Related U.S. Application Data

[63] Continuation-in-part of Ser. No. 883,669, Jul. 9, 1986, abandoned.

[30] Foreign Application Priority Data

Jul. 26, 1985 [JP] Japan .................................. 60-115646

[51] Int. Cl.$^4$ ............................................. H03C 1/02
[52] U.S. Cl. .................................... 332/164; 332/177; 455/108
[58] Field of Search .................... 332/31 R, 31 T, 40, 332/42, 52; 455/108, 323, 331; 375/41

[56] References Cited

U.S. PATENT DOCUMENTS 2,460,075  1/1949  Dickieson .............................. 332/40

Primary Examiner—Siegfried H. Grimm
Attorney, Agent, or Firm—Armstrong, Nikaido Marmelstein, Kubovcik & Murray

[57] ABSTRACT

An amplitude modulator for mixing multifrequency signals characterized in that there are combined a mixer for producing a mixed signal by mixing not less than two alternating current signals with different frequency and a signal generator for the modulator to modulate the mixed signal by applying modulation signal to the mixed signal. According to the present invention, the device can be simplified and miniaturized in comparison with the conventional one since the mixer and amplitude modulator are incorporated in the present invention, whereby reliability of the device is greatly improved.

3 Claims, 3 Drawing Sheets

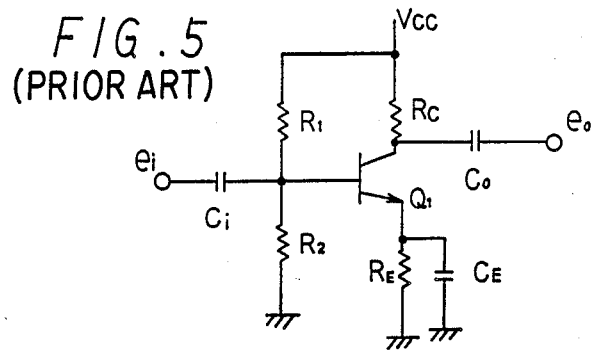
FIG. 5
(PRIOR ART)
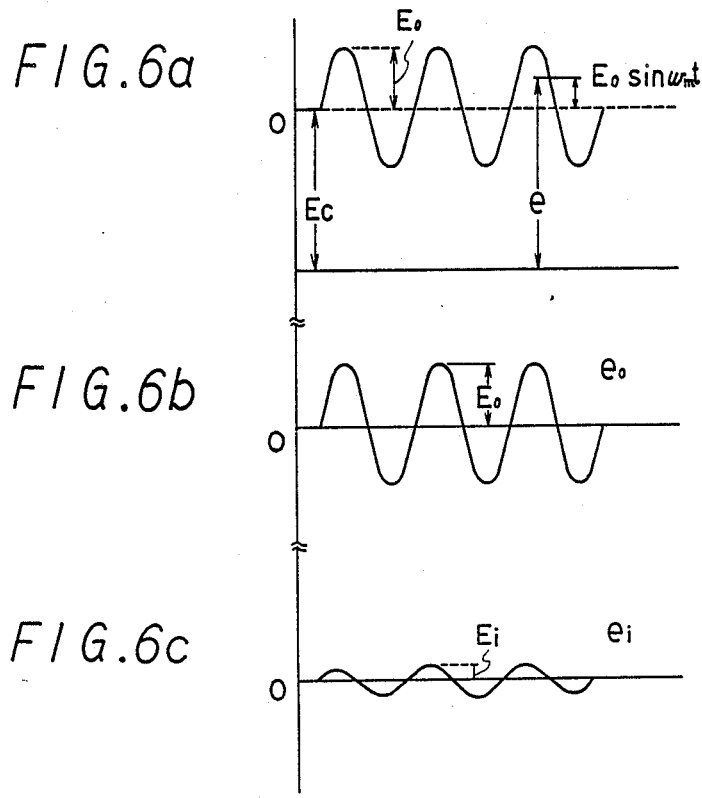
FIG. 6a
FIG. 6b
FIG. 6c

COMBINED AMPLITUDE MODULATOR AND FREQUENCY CONVERTER

CROSS-REFERENCE TO RELATED APPLICATION

This is a continuation-in-part of application Ser. No. 883,669 filed on July 9, 1986, now abandoned.

BACKGROUND OF THE INVENTION

The present invention relates to an amplitude modulator for mixing multifrequency signals which produces an output of a mixed signal by the use of an alternating current signal. This technique is useful in radar transponder applications such as secondary radar, identification systems and others.

Previously, an amplitude modulator for mixing multifrequency signals has comprised a mixer producing a mixed signal by the inputs of not less than two alternating current signals each having a different frequency than the other and an amplitude modulator.

FIG. 4 shows an embodiment of a conventional amplitude modulator for mixing multifrequency signals. In FIG. 4, the modulator comprises input terminals 6 and 7, a mixer 8, a diode switch 9, a modulation signal generator 10 and an output terminal 11 for modulated mixed signals.

The function of the above-mentioned modulator is explained below. Two alternating current signals $e_1$ of frequency $f_1$ and $e_2$ of frequency $f_2$, which frequencies differ from each other, are transmitted from input terminals 6 and 7, respectively, to the mixer 8. The mixer 8 generates innumerable side-band and higher harmonics with frequency of $n_1 f_1 \pm n_2 f_2$ (where $n_1$ and $n_2$ are integers).

The mixed signal, transmitted from mixer 8 to diode switch 9, is modulated into an amplitude modulated signal by a modulation signal $e_m$ of frequency $f_m$ from the modulation signal generator 10. Then, the amplitude modulated signal is transmitted from the output terminal 11. In the device explained here above, the alternating current signals $e_1$ of frequency $f_1$ and $e_2$ of frequency $f_2$ are applied to the input of mixer 8 and then the mixed signal output $e_0$ of frequency $f_0$ from the mixer, is amplitude modulated by diode switch 9. In mathematical terms, $e_1$, $e_2$, $e_m$ and $e_0$ are given by the following equations:

$$\begin{aligned} e_1 &= E_1 \sin \omega_1 t, \; e_2 = E_2 \sin \omega_2 t, \\ e_m &= E_m \sin \omega_m t \\ e_0 &= E_0 \sin \omega_0 t \; (\omega_x = 2\pi f_x) \\ &= E_0 (1 + m_1 \sin \omega_m t) \sin 2\pi (n_1 f_1 - n_2 f_2) t \end{aligned} \quad (1)$$

where
$E_1$, $E_2$, $E_m$, $E_0$: Max. amplitude constant
$\omega_1$, $\omega_2$, $\omega_m$, $\omega_0$: Angular velocity (rad/sec)
$m_i$: Modulation index ($0 \leq m_i \leq 1$).

Note that the phase angle has been ignored in the above expressions since it is unchanged by the amplitude modulation process.

Signals transmitting information are generally expressed in the form of alternating current. If direct current is used in the expression, it becomes hard to understand the mechanism of information transmission because the components of direct current which do not take part in the information transmission are required to be mathematically expressed.

However, in the case of embodying the information transmission in practice, it is necessary to employ electronic circuits wherein active devices are used. Such active devices need energy supply from the outside to demonstrate the functions thereof. Active devices comprise transistors and diodes which require direct current energy, i.e. direct current bias. Accordingly, in the case of explaining embodiments, the explanation cannot help being made in the form of direct current.

The above description will be clearly understood by the examination of, for example, an alternating current amplifier (see FIG. 5) using a bipolar transistor therein. In FIG. 5, the equation $e_0 = A e_i$ (where A is amplification degree) has a significant meaning. However, when the description of the action of a transistor Q, is required to explain the equation, it is necessary to include the analysis based on direct current in the description. $e_i$ and $e_0$ are both alternating current, but become such signals that have components of direct current in the circuit. $e_i$, $e_0$ and e in FIG. 6 are represented by the following equations.

$$e_i = E_i \sin \omega_m t$$

$$e_0 = E_0 \sin \omega_m t$$

$$e = E_c + E_0 \sin \omega_m t$$

where e is a voltage-applying signal at a collector of the transistor $Q_1$.

However, in the conventional amplitude modulator for mixing multifrequency signals, there are problems in that (1) both the mixer and amplitude modulator are required, and as a result, it is impossible to reduce the size of the modulator smaller than that of an assembled size of the mixer and amplitude modulator, and (2) when a PIN junction diode, or the like is employed for the diode switch, it requires the mixed signal to be amplitude modulated by transmitting about several tens of milliamperes of current from the circuit for generating the modulation signal to the diode switch.

The present invention overcomes the above-mentioned problems. It is an object of the present invention to simplify and miniaturize the amplitude modulator by combining the mixer and modulation signal generator.

SUMMARY OF THE INVENTION

In accordance with the present invention, an amplitude modulator is provided for mixing multifrequency signals characterized in that a mixer, for producing a mixed signal by mixing not less than two alternating current signals each having different frequency, is combined with a modulation signal generator, to modulate the mixed signal with a modulation signal.

In the amplitude modulator of the present invention, the amplitude modulation is carried out by intermittently transmitting direct current from the modulation signal generator to the diode of the mixer so that the diode switch is not required, whereby it is possible to simplify and miniaturize a device in accordance with the present invention compared with a conventional device.

In the present invention, an amplitude modulated signal is transmitted from the mixer since the conversion loss of the mixer fluctuates by transmitting intermittent direct current from the modulation signal generator.

BRIEF EXPLANATION OF THE DRAWINGS

FIG. 5 is a circuit diagram of an alternating current amplifier using a bipolar transistor therein;

FIG. 6a shows a waveform of an output signal obtained by adding DC bias Ec in FIG. 5 to AC output signal $e_0$;

FIG. 6b shows a waveform of AC output signal $e_0$ in FIG. 5; and

FIG. 6c shows a waveform of AC input signal $e_i$ in FIG. 5.

DETAILED DESCRIPTION

Figure 1:
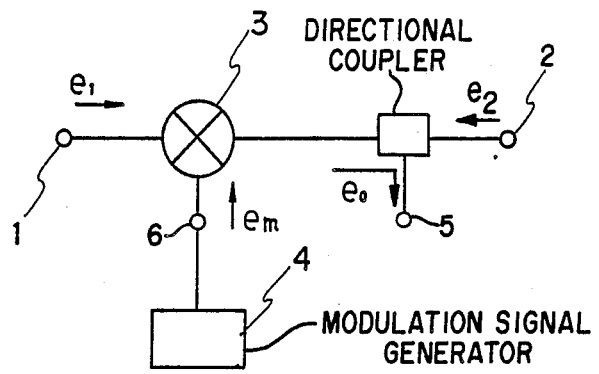
FIG. 1 is a block diagram showing schematically an embodiment of the present invention.

FIG. 1 is a block diagram showing schematically an embodiment of the present invention, wherein numerals 1 and 2 are input terminals, numeral 3 is a mixer, numeral 4 is a modulation signal generator and numeral 5 is an output terminal. FIG. 1 illustrates schematically one embodiment of an RF signal converter incorporating the present invention. As shown in FIG. 1, the RF signal converter mixes $e_1$ from terminal 1 and $e_2$ from terminal 2 in the mixer 3 (e.g. a mixer using a Schottky barrier diode (SBD)). The mixed and modulated signal $e_o$ is transmitted from terminal 5.

Therefore a reduction in size of the modulator can be realized by the present invention.

The operation of the above embodiment will be explained below. Two alternating current signals $e_1$ of frequency $f_1$ and $e_2$ of frequency $f_2$ having frequencies different from each other are applied to an input of the mixer 3 through input terminals 1 and 2. Then the innumerable side-band and higher harmonic modulated signals with a frequency of $n_1f_1 \pm n_2f_2$ ($n_1$ and $n_2$ are integers) appear at the output of the mixer 3. A microwave diode is usually employed as a mixer 3. When two microwaves are mixed in the mixer, a convension loss is generated. Equation (1) is necessarily satisfied in this invention.

Figure 2:
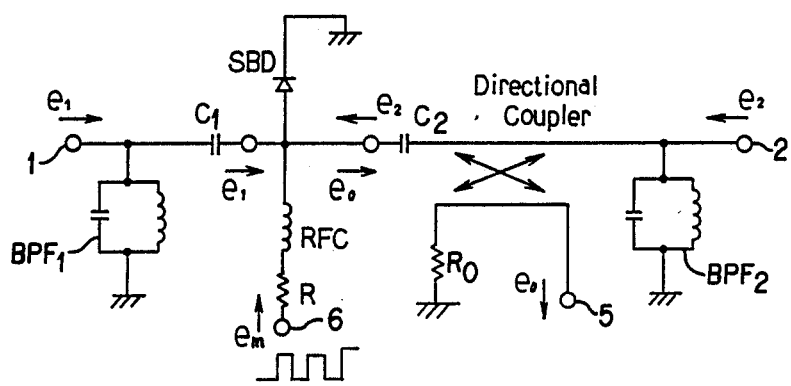
FIG. 2 is a circuit diagram of an embodiment of a device of the present invention.

FIG. 2 is a circuit diagram of an embodiment of a device of the present invention wherein a SBD (Schottky Barrier Diode) is used.

In FIG. 2, an input terminal is connected to an end of the SBD through a band pass filter (BPF1) and a condenser $C_1$, and an input terminal 2 is connected to the end of the SBD through a band pass filter (BPF2) and a condenser $C_2$. A terminal 6 for a modulation signal generator which supplies DC signal for modulation is connected to the end of the SBD through a radio frequency choke (RFC) and a bias resistance R. An output terminal 5 is provided through a directional coupler inserted between the end of the SBD and the input terminal 2. A circuit including the above-mentioned SBD, BPF1, BPF2, $C_1$, $C_2$, RFC and R corresponds to the mixer 3 of FIG. 1.

In the circuit having the above-mentioned structure, when an alternating current signal $e_1$ of frequency $f_1$ is input to input terminal 1 and an alternating current signal $e_2$ of frequency $f_2$ is input to input terminal 2, two alternating current signals are supplied to the SBD effectively by BPF1 and BPF2 so that mixed components $n_1f_1 \pm n_2f_2$ are generated. A DC signal for amplitude modulation is supplied to the terminal 6 to modulate the mixed components. The modulated signal is taken out from the output terminal 5.

In that case, when zero bias or reverse bias is applied to the SBD, the SBD represents almost an opened condition (i.e. it can be considered that only a line exists between the terminal 1 and the terminal 2), so that little signal appears at terminal 5. On the other hand, when a forward bias current is applied to the SBD, the SBD comes to function as a mixer since it is in the non-linear action region.

In order to decrease the conversion loss, DC square wave signal $e_m$ of frequency $f_m$ is transmitted from the modulation signal generator to the microwave diode in the mixer 3 to take advantage of the fact that application of a DC bias current to the input in the microwave diode is effective for decreasing the conversion loss, whereby the conversion loss in mixer 3 is decreased and accordingly the output of the mixer is increased.

Figure 3A:
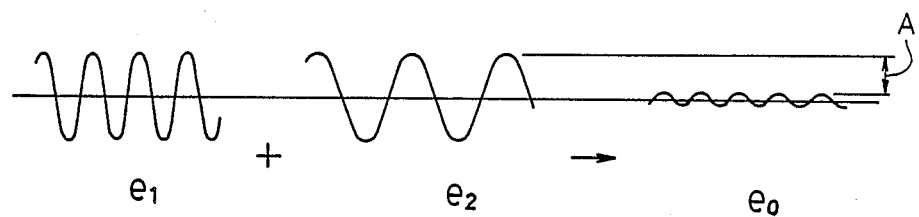
FIGS. 3a and FIG. 3b are schematic views showing conversion loss in a mixer.
Figure 3B:
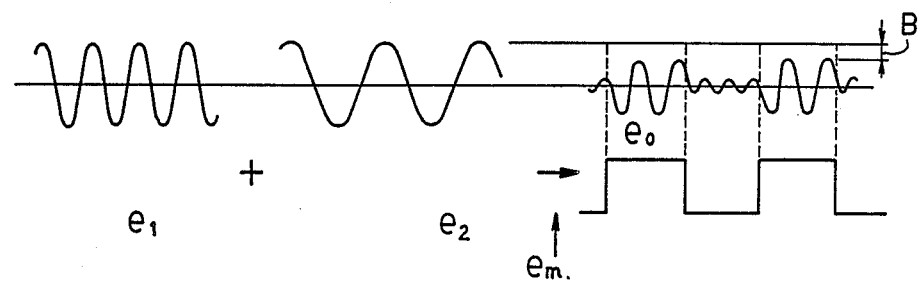

Concretely speaking, the conversion loss A is large when zero bias is applied to the microwave diode (i.e. when $e_m = 0$) as shown in FIG. 3a. On the other hand, the conversion loss B is smaller than that of A in zero bias when intermittent bias is applied to the microwave diode (i.e. $e_m$ is a rectangular signal) as shown in FIG. 3b. An amplitude modulation signal is thus transmitted from the output terminal 5 since the conversion loss of the mixer 3 fluctuates by intermittently transmitting direct current from the modulation signal generator 4.

Figure 4:
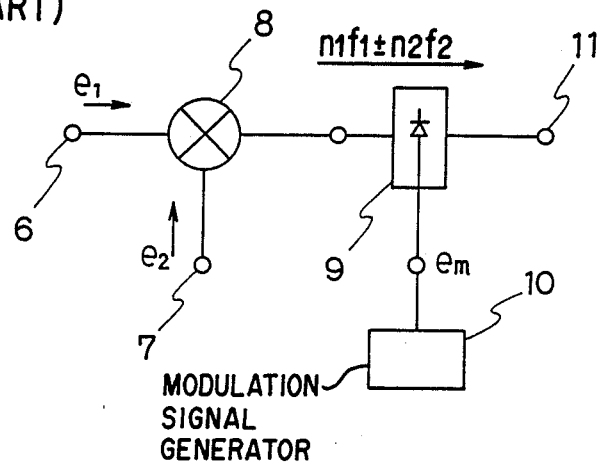
FIG. 4 is a block diagram showing an embodiment of a conventional amplitude modulator for mixing multifrequency signals.

In view of the above-described operation, in the device of the present invention, a diode switch is not required compared with the necessary device shown in FIG. 4 which requires a mixer and an amplitude modulator. As a result, the simplifying and miniaturization of the device of the present invention becomes possible.

According to the present invention, the device can be simplified and miniaturized in comparison with the conventional one since the mixer and amplitude modulator are incorporated together in the present invention. Thus, reliability of the device is also greatly improved.

With respect to miniaturization, the size of a device in accordance with the present invention can be reduced to about two-thirds the size of a conventional device, i.e. a device of about, for example, 80 mm$^W$ × 52 mm$^L$ × 1.5 mm$^H$ in size (where W, L and H mean width, length and height of the device respectively) can be obtained with the present invention.

What we claim is:

1. A combined amplitude modulator and frequency converter comprising:
   a non-linear solid state device having a conversion loss which varies in accordance with a DC bias applied thereto;
   means for applying a first alternating current signal $e_1$ of frequency $f_1$ to a terminal of said device;
   means for applying a second alternating current signal $e_2$ of frequency $f_2$ to said terminal of said device;
   means for applying to said terminal of said device a modulating signal $e_m$ comprising an amplitude modulated direct current voltage; and
   output circuit means connected to said terminal of said device for transmitting therefrom output signals of frequency $n_1f_1 \pm n_2f_2$, where $n_1$ and $n_2$ are integers, the output signals being modulated by the modulating signal $e_m$.

2. A combined amplitude modulator and frequency converter as recited in claim 1, wherein said output circuit means includes a directional coupler.

3. A combined amplitude modulator and frequency converter as recited in claim 1, wherein said modulating signal $e_m$ is an intermittent rectangular bias signal.

* * * * *